(12) United States Patent
Bolken et al.

(10) Patent No.: US 8,212,348 B2
(45) Date of Patent: *Jul. 3, 2012

(54) TECHNIQUES FOR PACKAGING MULTIPLE DEVICE COMPONENTS

(75) Inventors: Todd O. Bolken, Star, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/839,834

(22) Filed: Jul. 20, 2010

(65) Prior Publication Data

US 2010/0283151 A1 Nov. 11, 2010

Related U.S. Application Data

(60) Division of application No. 11/708,196, filed on Feb. 20, 2007, now Pat. No. 7,781,875, which is a continuation of application No. 11/021,175, filed on Dec. 23, 2004, now Pat. No. 7,179,681, which is a division of application No. 10/386,254, filed on Mar. 11, 2003, now Pat. No. 6,856,009.

(51) Int. Cl.
*H01L 21/00* (2006.01)
(52) U.S. Cl. ............ 257/686; 257/777; 257/778
(58) Field of Classification Search .......... 257/686, 257/777, 778
See application file for complete search history.

(56) References Cited

U.S. PATENT DOCUMENTS

| | | | |
|---|---|---|---|
| 5,903,049 A * | 5/1999 | Mori .................. | 257/686 |
| 6,081,429 A | 6/2000 | Barrett | |
| 6,143,581 A * | 11/2000 | Johnson et al. ............. | 438/26 |
| 6,294,825 B1 * | 9/2001 | Bolken et al. .............. | 257/676 |
| 6,329,220 B1 * | 12/2001 | Bolken et al. .............. | 438/106 |
| 6,376,914 B2 | 4/2002 | Kovats et al. | |
| 6,400,574 B1 * | 6/2002 | Stephenson et al. ......... | 361/760 |
| 6,417,018 B1 * | 7/2002 | Bolken et al. .............. | 438/26 |
| 6,444,501 B1 * | 9/2002 | Bolken ................... | 438/127 |
| 6,531,763 B1 * | 3/2003 | Bolken et al. .............. | 257/667 |
| 6,538,311 B2 * | 3/2003 | Bolken ................... | 257/679 |
| 6,558,600 B1 | 5/2003 | Williams et al. | |
| 6,576,496 B1 * | 6/2003 | Bolken et al. .............. | 438/110 |
| 6,583,502 B2 * | 6/2003 | Lee et al. ................. | 257/686 |
| 6,737,750 B1 * | 5/2004 | Hoffman et al. ............ | 257/777 |
| 6,762,488 B2 * | 7/2004 | Maeda et al. .............. | 257/686 |
| 6,841,858 B2 | 1/2005 | Shim et al. | |
| 6,856,009 B2 * | 2/2005 | Bolken et al. .............. | 257/686 |
| 6,919,631 B1 * | 7/2005 | Hoffman et al. ............ | 257/707 |
| 6,936,929 B1 | 8/2005 | Mostafazadeh et al. | |
| 6,964,881 B2 | 11/2005 | Chua et al. | |
| 7,015,587 B1 | 3/2006 | Poddar | |
| 7,030,473 B2 | 4/2006 | Reiss et al. | |
| 7,095,096 B1 | 8/2006 | Mostafazadeh | |

(Continued)

*Primary Examiner* — Laura Menz
(74) *Attorney, Agent, or Firm* — Fletcher Yoder

(57) ABSTRACT

Techniques for fabricating multiple device components. Specifically, techniques for fabricating a stacked package comprising at least one I/C module and a multi-chip package. The multi-chip package includes a plurality of integrated circuit dices coupled to a carrier. The dice are encapsulated such that conductive elements are exposed through the encapsulant. The conductive elements are electrically coupled to the chips. The I/C module comprises an interposer having a plurality of integrated circuit dice disposed thereon. The dice of the I/C module are electrically coupled to the interposer via bondwires. The interposer is configured such that vias are aligned with the conductive elements on the multi-chip package. The multi-chip package and I/C module may be fabricated separately and subsequently coupled together to form a stacked package.

16 Claims, 8 Drawing Sheets

U.S. PATENT DOCUMENTS

| | | |
|---|---|---|
| 7,122,404 B2 * | 10/2006 | Bolken et al. .................. 438/110 |
| 7,144,800 B2 | 12/2006 | Mostafazadeh et al. |
| 7,179,681 B2 * | 2/2007 | Bolken et al. .................. 438/106 |
| 7,425,758 B2 | 9/2008 | Corisis et al. |
| 7,518,236 B2 * | 4/2009 | Delgado et al. ............... 257/723 |
| 7,544,727 B2 | 6/2009 | Ikezawa et al. |
| 7,638,362 B2 | 12/2009 | Ishino et al. |
| 7,684,205 B2 | 3/2010 | Pai |
| 7,781,875 B2 * | 8/2010 | Bolken et al. .................. 257/678 |
| 7,804,171 B2 * | 9/2010 | Bolken et al. .................. 257/724 |
| 2003/0164551 A1 | 9/2003 | Lee et al. |
| 2003/0201548 A1 | 10/2003 | Ikezawa et al. |
| 2004/0178482 A1 * | 9/2004 | Bolken et al. .................. 257/678 |
| 2004/0178488 A1 * | 9/2004 | Bolken et al. .................. 257/686 |
| 2005/0023662 A1 * | 2/2005 | Bolken et al. .................. 257/678 |
| 2005/0106779 A1 * | 5/2005 | Bolken et al. .................. 438/106 |
| 2005/0133916 A1 * | 6/2005 | Karnezos ....................... 257/738 |
| 2006/0017148 A1 | 1/2006 | Lee |
| 2006/0240595 A1 | 10/2006 | Lee et al. |
| 2007/0145556 A1 * | 6/2007 | Bolken et al. .................. 257/678 |
| 2008/0299709 A1 | 12/2008 | Corisis et al. |
| 2008/0316728 A1 | 12/2008 | Corisis et al. |
| 2009/0026607 A1 | 1/2009 | Huebner et al. |
| 2009/0057887 A1 * | 3/2009 | Mclellan et al. ............... 257/737 |
| 2010/0044878 A1 | 2/2010 | Ha et al. |
| 2010/0052087 A1 * | 3/2010 | McElrea et al. ............... 257/433 |
| 2010/0117224 A1 * | 5/2010 | McElrea et al. ............... 257/723 |
| 2010/0283151 A1 * | 11/2010 | Bolken et al. .................. 257/738 |

* cited by examiner

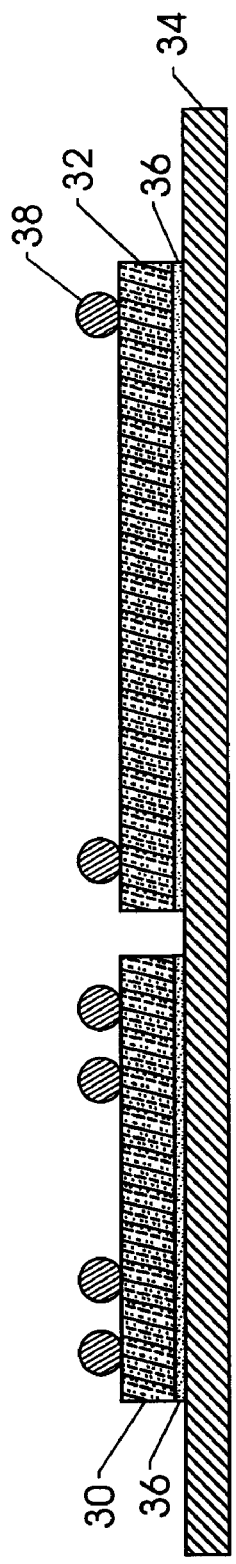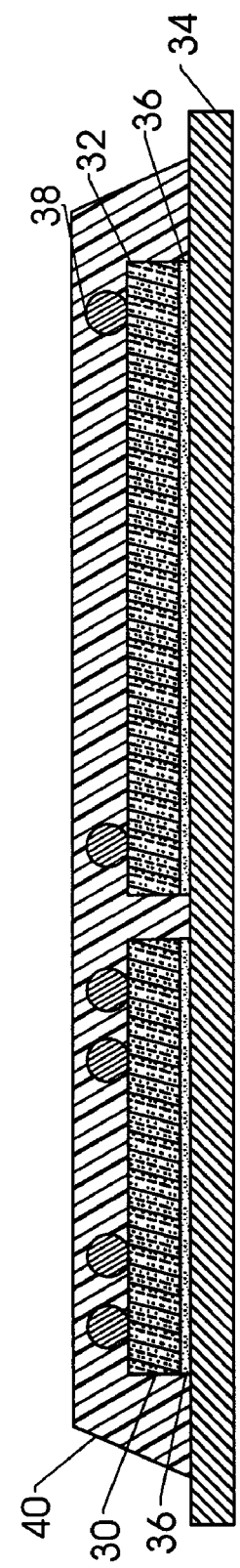

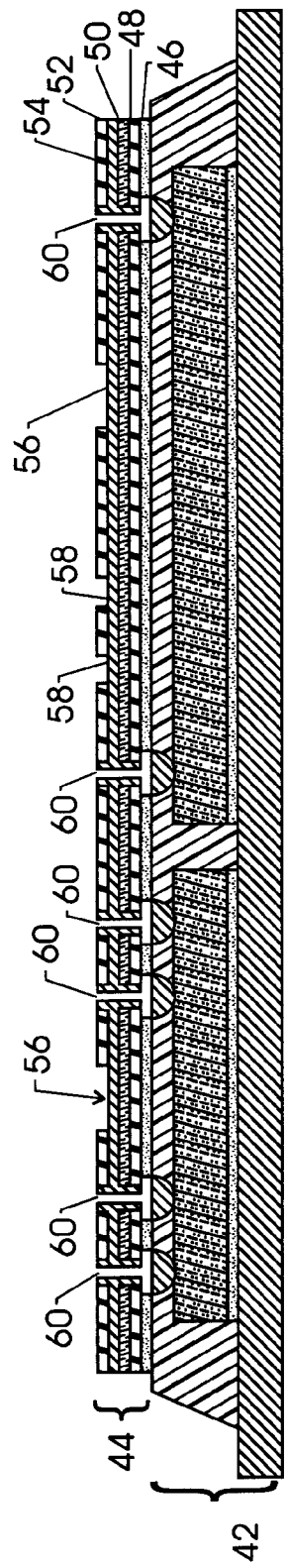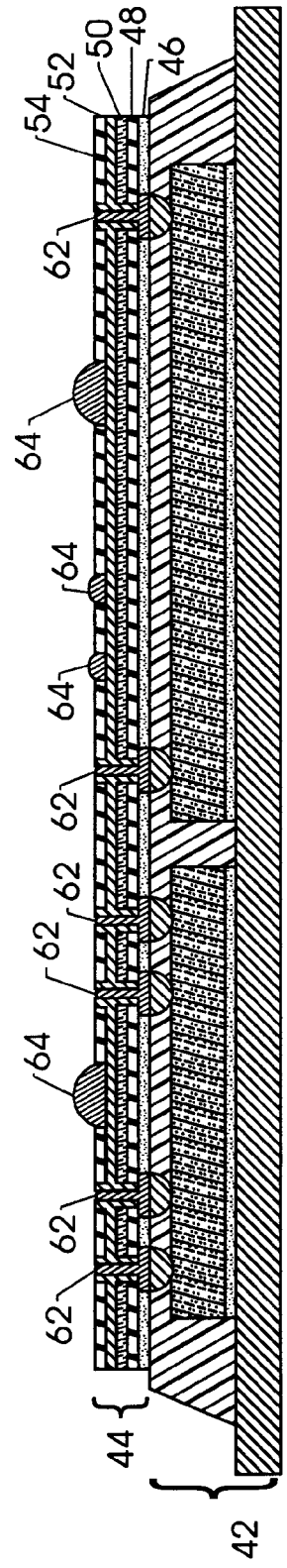
FIG. 5
FIG. 6

TECHNIQUES FOR PACKAGING MULTIPLE DEVICE COMPONENTS

CROSS-REFERENCE TO RELATED APPLICATIONS

This application is a divisional of U.S. application Ser. No. 11/708,196, filed Feb. 20, 2007, which is a continuation of U.S. application Ser. No. 11/021,175, filed on Dec. 23, 2004, now U.S. Pat. No. 7,179,681, which issued on Feb. 20, 2007, which is a divisional of U.S. application Ser. No. 10/386,254, filed on Mar. 11, 2003, now U.S. Pat. No. 6,856,009 which issued on Feb. 15, 2005.

BACKGROUND OF THE INVENTION

1. Field of the Invention

The present invention relates generally to electrical circuitry and, more particularly, to techniques for packaging electronic devices.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Packaging of integrated circuit devices is a key element in the technological development of systems implementing electrical components. Various techniques have been developed to meet the continued demands for improving system performance and hardware capabilities, while the space in which to provide these improved hardware capabilities continues to decrease.

Multiple integrated circuit devices may be fabricated within a single package, thereby forming a multi-chip module. A single multi-chip module may include two or more independent integrated circuit devices, which may be arranged adjacent to one another or on top of one another on a substrate, and which are encapsulated such that a single discrete package having multiple chips or integrated circuit devices is formed. Each of the integrated circuit devices that make up the multi-chip module may be electrically coupled to the substrate. The substrate may include one or more layers of conductive traces separated by dielectric materials. The traces redistribute signals from the integrated circuit devices. The multi-chip module may be implemented in a system. Techniques for packaging electronic components and forming multi-chip modules provide a number of fabrication challenges with respect to electrical conductivity, heat-transfer, limited design space, manufacturability, robustness, package density, operability, and the like.

BRIEF DESCRIPTION OF THE DRAWINGS

Advantages of the invention may become apparent upon reading the following detailed description and upon reference to the drawings in which:

FIGS. 2-9 illustrate cross sectional views of exemplary techniques for fabricating a multi-chip package in accordance with embodiments of the present invention;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
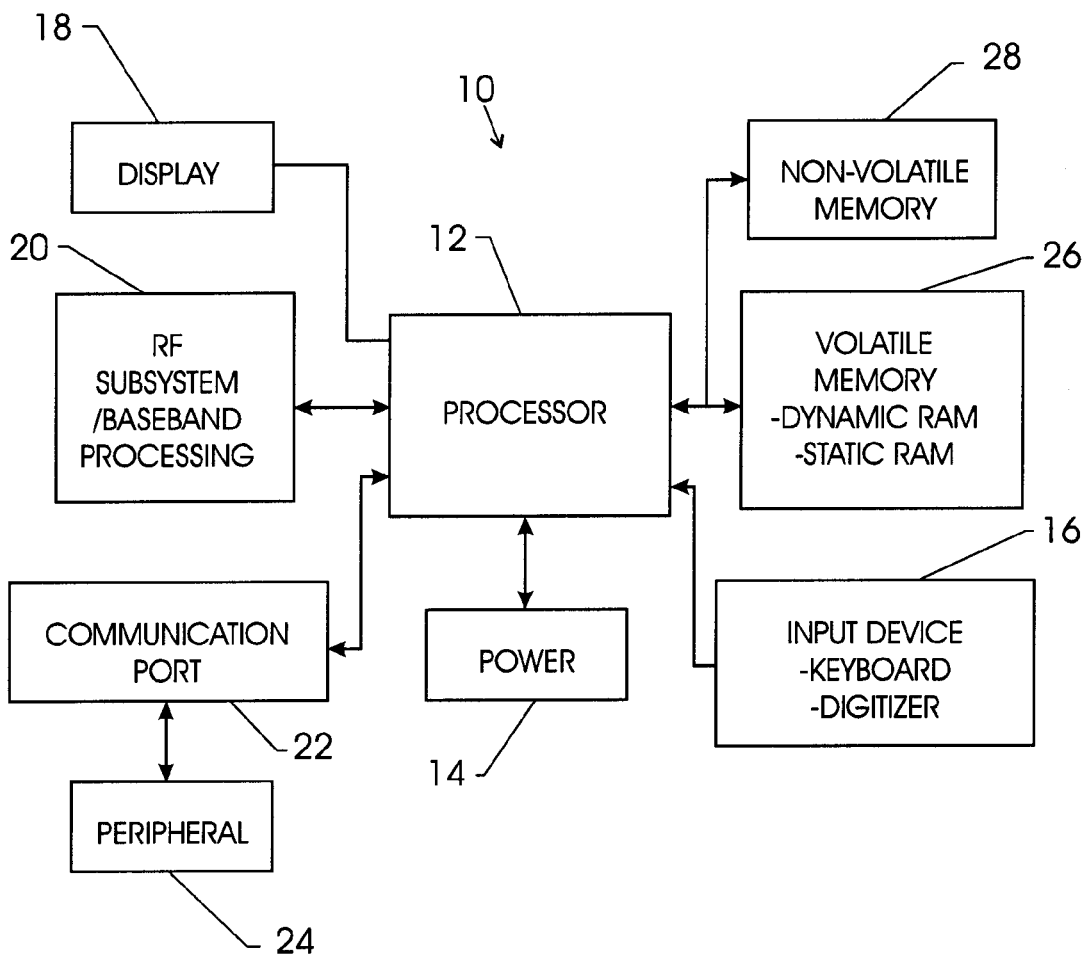
FIG. 1 illustrates a block diagram of an exemplary processor-based device in accordance with the present techniques.

Turning now to the drawings, and referring initially to FIG. 1, a block diagram of an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 may include a power supply 14. For instance, if the device 10 is portable, the power supply 14 may advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory may be coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

As can be appreciated, one or more of the components of the device 10 may be packaged together to form a portion of the device 10. For instance, a number of memory chips or devices may be coupled to a substrate and encapsulated together to form a package for use in the volatile memory 26. Alternatively, a package may be formed such that the processor 12 and a memory device are coupled to a substrate and encapsulated together. As can be appreciated, any number of component combinations may be implemented to form system-in-package (SIP) modules. As used herein, "SIPs" or "SIP modules," generally refer to packages having two or more integrated circuit die, such as a memory devices and/or processors, which are coupled to a substrate or carrier and encapsulated together to form a multi-chip package. As described below, the SIP module may include a number of conductive elements and an interposer to facilitate the redistribution of electrical signals to and from the devices. By packaging a number of devices together, SIP modules may be implemented in a variety of system applications, as can be appreciated by those skilled in the art.

Referring specifically to FIG. 2, a cross-sectional view of a first integrated circuit (I/C) die 30 and a second integrated circuit (I/C) die 32 is illustrated. The first and second I/C die 30 and 32 may include any combination of semiconductor devices, such as microprocessors, microcontrollers, random access memory (RAM) devices, read only memory (ROM), flash memory devices, application specific integrated circuits (ASICs), integrated optic devices, integrated sensors, power devices, etc. In the present exemplary embodiment, the first I/C die 30 may be a memory chip, such as a dynamic random access memory (DRAM) chip, and the second I/C die 32 may be a microprocessor chip, for instance.

As can be appreciated, each of the first and second I/C dice 30 and 32 may be attached or laminated to a substrate or carrier 34, using an adhesive material 36 for example. The adhesive material 36 may comprise an epoxy, paste, or tape, for example. The carrier 34 may comprise a ceramic material, polyamide material, silicon, or glass, for example. In one embodiment, the carrier 34 may comprise a substantially rigid material. Alternatively, the carrier 34 may be comprise a flexible material, such as a polyimide film. Further, the carrier 34 may comprise a conductive material, such as copper. Advantageously, a conductive carrier 34, such as a copper carrier, may provide a heat-sink for the dice 30 and 32.

Each of the dice 30 and 32 may include a number of conductive elements that are electrically coupled to conductive pads (not shown) on the backside of the dice 30 and 32. As can be appreciated, the conductive pads on each dice 30 and 32 are coupled to integrated circuits within the dice 30 and 32 to provide signal/voltage paths to and from the dice 30 and 32. In the present exemplary embodiment, the conductive elements comprise conductive balls, such as solder balls 38. However, depending on the size of the dice 30 and 32 and manufacturing capabilities, the conductive elements may comprise stud bumps, metal ribbons, or other conductive materials, as can be appreciated by those skilled in the art. In one exemplary embodiment, the solder balls 38 may be coupled to the dice 30 and 32 before lamination to the carrier 34. Alternatively, the solder balls 38 may be coupled to the dice 30 and 32 after lamination of the dice 30 and 32 to the carrier 34.

Figure 3B:
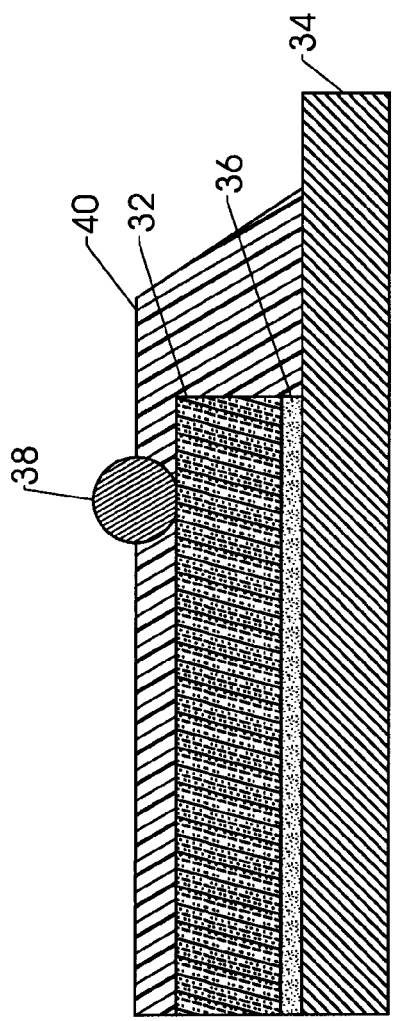

After deposition of the solder balls 38 (or alternative conductive elements), an encapsulant 40 may be disposed about the dice 30 and 32, as illustrated in FIG. 3A. The encapsulant 40 may comprise a dielectric filler material, such as a silicone, rubber, resin, plastic, or molding compound, for example. As can be appreciated, the encapsulant 40 may be implemented to seal and protect the dice 30 and 32 from external elements. The encapsulant 40 may be disposed using a transfer molding technique or a liquid dispensing technique, wherein the dice 30 and 32 and solder balls 38 are completely enclosed by the encapsulant 40, as illustrated in FIG. 3A. Alternatively, a compression molding technique may be implemented to dispose the encapsulant 40 such that the conductive elements, here the solder balls 38, protrude from the encapsulant 40 after the encapsulant 40 is disposed and hardened, as illustrated in FIG. 3B.

Figure 4:
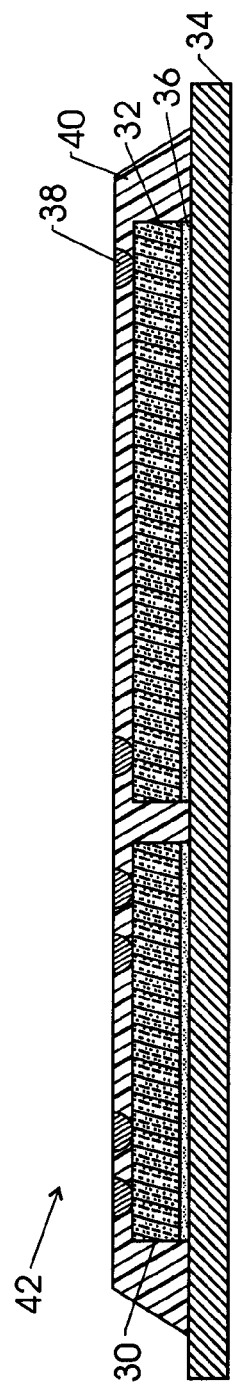

As can be appreciated, if the encapsulant 40 is disposed such that the solder balls 38 (or alternative conductive elements) are completely covered, a planarizing or grinding technique may be implemented after the encapsulation process to expose portion of the conductive elements. For instance, if a transfer molding technique or a liquid encapsulating technique is implemented to dispose the encapsulant 40, the surface of the encapsulant 40 may be ground to such a depth as to expose the underlying solder balls 38, as illustrated with reference to FIG. 4. As can be appreciated, a portion of the solder balls 38 may also be removed during the planarizing technique. Advantageously, by grinding the surface of the encapsulant 40, a portion of the solder balls 38 is exposed, thereby providing an electrical signal path from each of the dice 30 and 32 to the outer surface of the encapsulant 40. The resulting multi-chip package 42 having exposed conductive elements may be electrically coupled to other packages or to a system, as described further below.

Alternatively, the multi-chip package 42 may be fabricated such that the solder balls 38 are completely omitted. In this exemplary embodiment, the conductive pads on the backside of the dice 30 and 32 comprise the conductive elements. Accordingly, the encapsulant 40 may be disposed such that the conductive pads on the backsides of the dice 30 and 32 are left exposed. Alternatively, the encapsulant 40 may be omitted entirely.

After fabricating the multi-chip package 42 having exposed conductive elements, an interposer 44 may be coupled to the multi-chip package 42, as illustrated in FIG. 5. The interposer 44 may comprise one or more redistribution layers (RDLs) to redistribute the electrical contacts (here solder balls 38) for electrical coupling to a printed circuit board, for instance. Because the exemplary multi-chip package 42 is planarized, as described with reference to FIG. 4, the surface of the interposer 44 may be laminated directly to the top surface of the encapsulant 40.

Generally, the interposer 44 includes one or more conductive layers which are patterned to form signal paths. Dielectric layers are disposed on the outer surfaces of the interposer 44, as well as between the conductive layers. Vias are generally formed through the interposer 44, and a conductive material is disposed in the vias to provide a vertical path for electrical signals, as can be appreciated. The present exemplary interposer 44 includes an adhesive layer 46. The adhesive layer 46 may comprise a non-conductive tape, paste, or epoxy for example. Alternatively, if a compression molding technique is implemented to encapsulate the die 30 and 32, such that the encapsulant conforms about the solder balls 38 and provides an exposed portion, as illustrated in FIG. 3B, the adhesive layer 46 may be omitted.

The present exemplary interposer 44 further may include a first solder mask layer 48, a polyamide layer 50, a conductive trace layer 52, and a second solder mask layer 54. However, as can be appreciated, the interposer 44 may include a number of acceptable conductive and dielectric materials to facilitate the redistribution of signal paths from the dice 30 and 32. The trace layer 52 may comprise a layer of metal, such as gold or aluminum, which is disposed and etched to form conductive traces. The conductive traces are implemented to carry electrical signals to and from desired locations on the dice 30 and 32. As can be appreciated, the interposer 44 may include more than one trace layer 52 separated from adjacent trace layers by dielectric layers. The trace layer 52 may include a number of conductive pads 56 and 58 that are exposed through openings in the second solder mask layer 54. The conductive pads 56 and 58 may be implemented to electrically couple the die 30 and 32 to discrete devices, other multi-chip packages, or a system board, as described further below.

Further, the interposer 44 comprises a plurality of vias 60 which are configured to provide openings to expose the underlying conductive elements, here the planarized surface of the solder balls 38. As used herein, "adapted to," "configured to," and the like refer to elements that are arranged or manufactured to form a specified structure or to achieve a specified result. As can be appreciated, the vias 60 are aligned with the conductive elements (planarized solder balls 38) during lamination of the interposer 44 to the multi-chip package 42. Further, the first layer of the interposer 44, here the adhesive layer 46, may be configured to provide openings at the bottom of each of the vias 60, such that the openings in the adhesive layer 46 correlate approximately to the size of the exposed conductive elements (planarized solder balls 38). As can be appreciated, the walls of the vias 60 may be coated with the same material that is implemented in the conductive trace layer 52 to further increase the conductivity through the vias 60.

FIG. 6 illustrates the interposer 44 coupled to the multi-chip package 42, after deposition of a conductive material 62 into the vias 60. The conductive material 62 may comprise solder, for example. As can be appreciated, the conductive material 62 may be disposed into the vias 60 such that the conductive material 62 contacts the exposed portions of the underlying conductive elements (planarized solder balls 38). The conductive material 62 electrically couples the dice 30 and 32 to the trace layer 52, including the conductive pads 56 and 58. A conductive material 64 may also be disposed on each of the conductive pads 56 and 58. The conductive material 64 may comprise the same material as the conductive material 62. In the present exemplary embodiment, the conductive material 64 comprises a solder paste. In one exemplary embodiment, the conductive material 64 that is disposed on the conductive pads 56 may be different from the conductive material that is disposed on the conductive pads 58.

Figure 7:
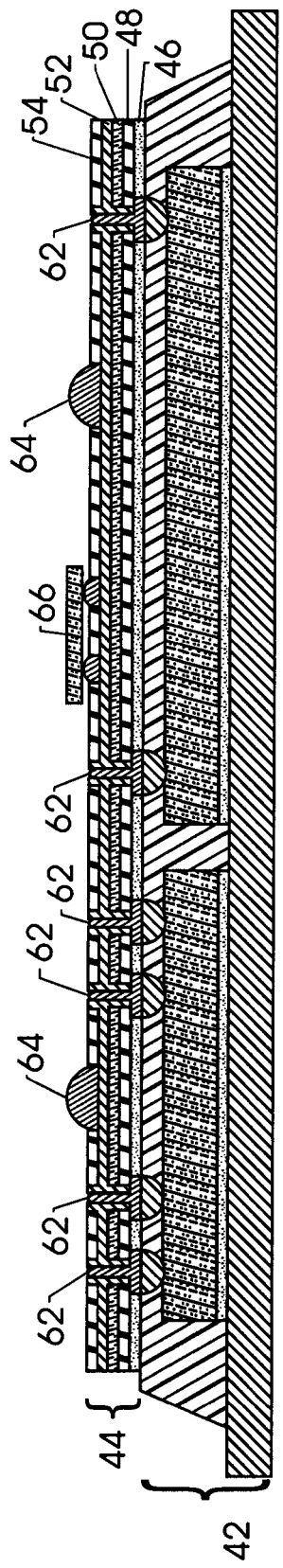

Referring to FIG. 7, the conductive material 64 disposed on the conductive pads 58 may be implemented to electrically couple a discrete device 66 to the backside of the interposer 44. The discrete device 66 may comprise a memory device, such as an erasable programmable read only memory (EPROM) device, for example. Advantageously, by implementing the backside of the interposer 44 for components, such as the discrete device 66, space savings may be realized. The discrete device 66 comprises an integrated circuit die which may be encapsulated in a molding compound, for example. As can be appreciated, the multi-chip module may or may not include one or more discrete devices, such as the discrete device 66, coupled to the side of the interposer 44 opposite the multi-chip package.

Figure 8:
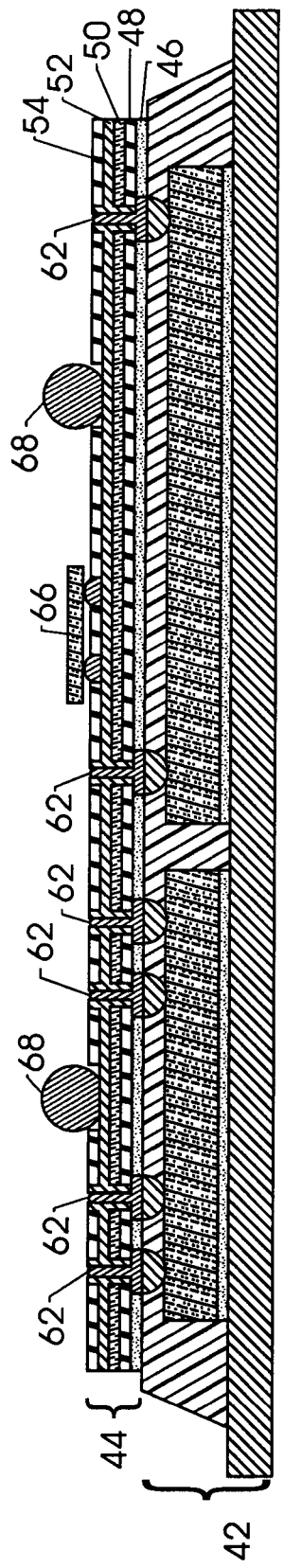

After attaching any additional devices, such as the discrete device 66, to the backside of the interposer 44, the conductive material 64 disposed on the conductive pads 56 may be reflowed during a heating process to form conductive balls 68, as illustrated in FIG. 8. As can be appreciated, the conductive balls 68 (here solder balls) may be implemented to electrically and physically couple the module to another module or a system board. Advantageously, the conductive balls 68 have a diameter greater than the thickness of the discrete device 66.

Figure 9:
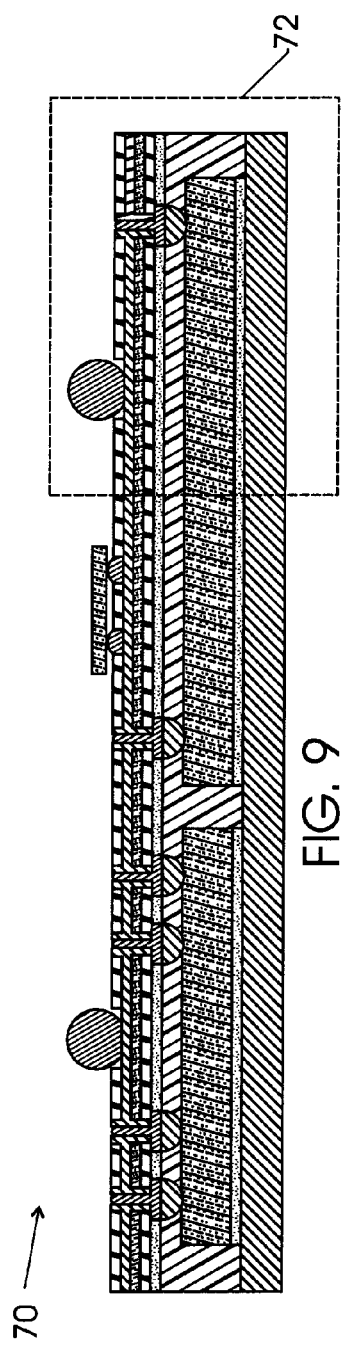
Figure 10:
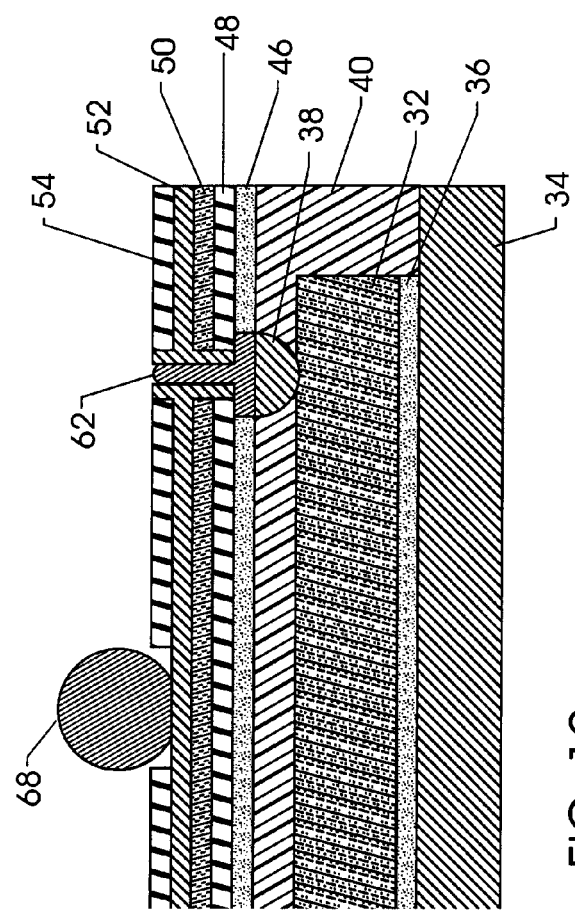
FIG. 10 illustrates an exploded view of a portion of the cross-sectional view illustrated with reference to FIG. 9.

Finally, the multi-chip package 42 may be singulated to form the integrated circuit module 70, as illustrated in FIG. 9. Alternatively, the multi-chip package 42 may be singulated before lamination to the interposer 44. In the present exemplary embodiment, the I/C module comprises a SIP having a memory die (I/C die 30), a processor (I/C die 32), and an EPROM (discrete device 66). FIG. 10 illustrates an exploded view of the cross-section of the I/C module 70 illustrated in FIG. 9 and indicated by dashed lines 72. As can be appreciated, by prefabricating the interposer 44 and the multi-chip package 42 and then laminating them together, fabrication of the I/C module 70 may be simplified.

Figure 11:
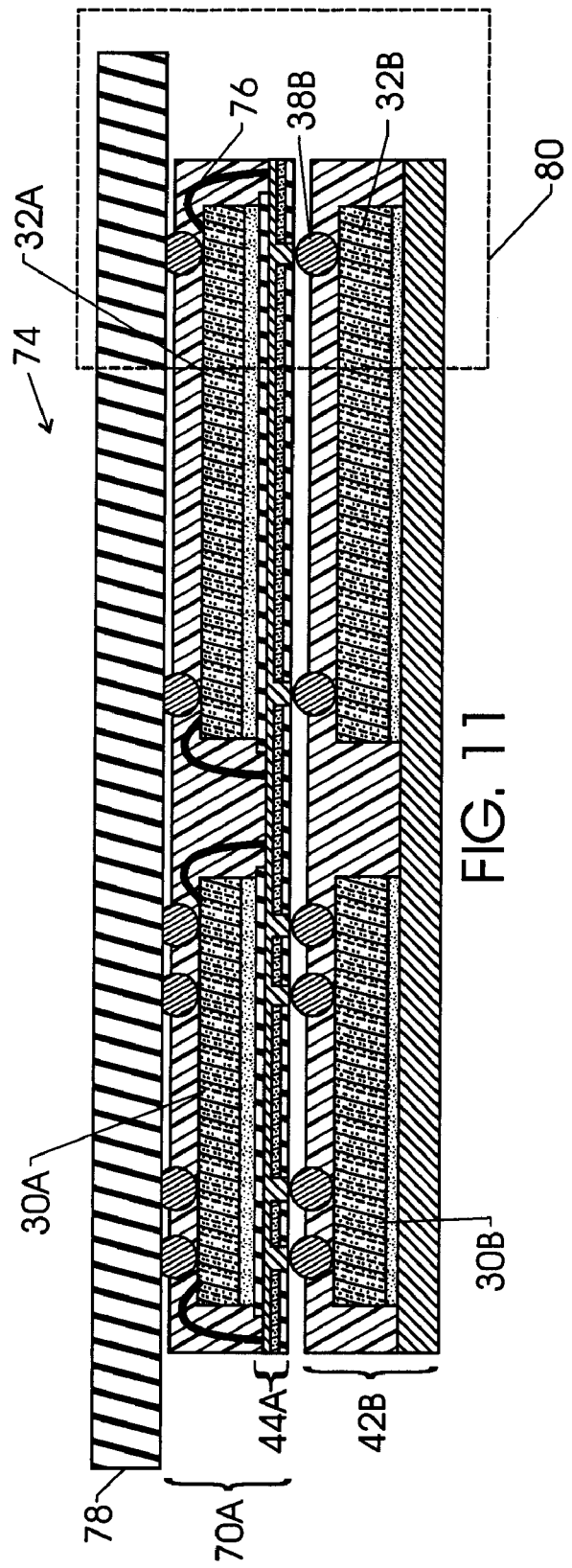
FIGS. 11 and 12 illustrated cross sectional views of exemplary techniques for fabricating a stacked package in accordance with embodiments of the present invention.
Figure 12:
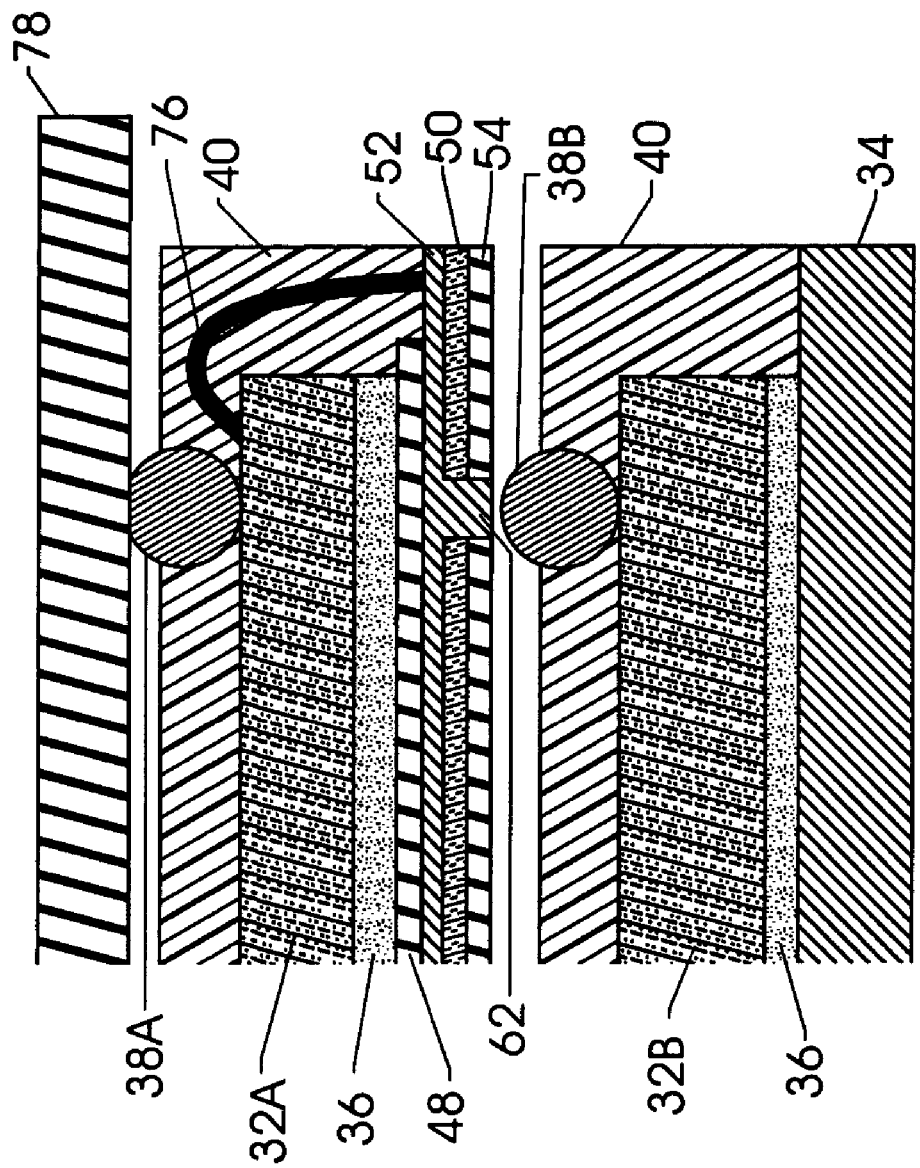

The techniques described above may be also be implemented in conjunction with stacking techniques to advantageously improve electrical performance capabilities without increasing the space occupied on a system board. FIG. 11 illustrates an exemplary embodiment of a stacked package 74, fabricated in accordance with the present techniques. FIG. 12 illustrates an exploded view of the cross-section of the stacked package 74 illustrated in FIG. 11 and indicated by dashed lines 80. Accordingly the following description should be reviewed in conjunction with FIGS. 11 and 12. For simplicity, like reference numerals have been used to designate like elements, previously described with reference to FIGS. 2-10.

The package 74 includes an I/C module 70A comprising an interposer 44A having dice 30A and 32A disposed thereon. The exemplary stacked package 74 also includes a multi-chip package 42B. As previously described, the multi-chip package 42B may include a plurality of dice, such as the dice 30B and 32B. The dice 30A, 32A, 30B and 32B may include any combination of semiconductor devices, such as microprocessors, microcontrollers, random access memory (RAM) devices, read only memory (ROM), flash memory devices, application specific integrated circuits (ASICs), integrated optic devices, integrated sensors, power devices, etc.

The multi-chip package 42B may be fabricated as described above with reference to FIGS. 2-4. In the present exemplary embodiment, the multi-chip package 42B may be fabricated using a compression molding technique, as described with reference to FIG. 3B. Accordingly, the conductive elements, here the solder balls 38, protrude from the encapsulant 40, as previously described. Alternate embodiments of the multi-chip package 42B may also be implemented, as previously described.

Advantageously, the I/C module 70A may be fabricated separately from the multi-chip package 42B and subsequently attached to the multi-chip package 42B. The I/C module 70A comprises an interposer 44A. As previously described, the interposer 44A includes one or more conductive layers which are patterned to form conductive traces to provide electrical signal paths. Dielectric layers are disposed on the outer surfaces of the interposer 44A, as well as between the conductive layers. Vias are generally formed through the interposer 44A and a conductive material is disposed in the vias to provide a vertical path for electrical signals.

More specifically, the present exemplary interposer 44A includes a first solder mask layer 54, a polyamide layer 50, a conductive trace layer 52 and a second solder mask layer 48. However, as can be appreciated, the interposer 44A may include a number of acceptable conductive and dielectric materials to facilitate the redistribution of signals from the dice 30A and 32A which are attached to the interposer via an adhesive material 36. The adhesive material may comprise an epoxy, paste, or tape, for example. The conductive layer 52 may comprise a layer of metal, such as gold or aluminum, which is disposed and etched to form conductive traces. The conductive traces are implemented to carry electrical signals to and from desired locations on the dice 30A and 32A. Accordingly, to carry signals to and from the dice 30A and 32A, the dice 30A and 32A are electrically coupled to the trace layer 52 via bond wires 76. As can be appreciated, bond pads (not shown) are disposed on the top surface of each of the dice 30A and 32A. The bond wires 76 are coupled from the respective bond pads to a corresponding pad or trace on the conductive layer 52. As previously described, vias filled with a conductive material (e.g., solder or gold) 62 may be implemented to carry signals vertically through the interposer 44A.

After encapsulation, the I/C module 70A may be coupled to the multi-chip package 42B. The vias filled with conductive material 62 of the interposer 44A are configured to align with the conductive elements, here solder balls 38B, of the multi-chip module 42B. Accordingly, the dice 30B and 32B may be electrically coupled to the dice 30A and 32A via the signal paths created by the solder balls 38B of the multi-chip package 42B, the vias filled with conductive material 62, the traces of the conductive layer 52 and the bond wires 76. Further, solder balls 38B on the topside of the dice 30A and 32A may be implemented to electrically couple the I/C module 70A to a system board 78. Advantageously, the electrically conductive paths provided in the present stacked configuration provide signal paths to and from each of the dice 30A and 32A, as well as the dice 30B and 32B. As can be appreciated, additional I/C modules 70A may included in the stacked package 74. For instance, a second I/C module (not shown) may be coupled between the I/C module 70A and the system board 78. As can be appreciated, by pre-fabricating each of the I/C modules 70A and the multi-chip module 42B and then laminating them together, fabrication of the stacked package 74 may be simplified.

As can be appreciated, because the present exemplary multi-chip package 42B is compression molded, and therefore the conductive elements, here solder balls 38B, protrude beyond the plane of the encapsulant 40, an adhesive layer may be omitted between the multi-chip package 42B and the I/C module 70A. The present exemplary interposer 44A does not include an adhesive layer 46 (previously described with reference to FIG. 5). Accordingly, in the present exemplary embodiment, the solder balls 38B of the multi-chip package 42B provide for electrical and mechanical coupling to the I/C module 70A. Alternatively, an adhesive layer may be included between the interposer 44A and the multi-chip package 42B to improve adhesion. As can be appreciated, an adhesive layer may also be implemented if alternate molding techniques (previously described with reference to FIG. 3A) are implemented.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A stacked package comprising:
a multi-chip package comprising a first plurality of integrated circuit dice, wherein a bottom surface of each of the first plurality of integrated circuit dice is coupled to a carrier, and wherein the multi-chip package further comprises a first plurality of conductive elements disposed on a top surface of each of the first plurality of integrated circuit dice; and
an integrated circuit module comprising a second plurality of integrated circuit dice, wherein a bottom surface of each of the second plurality of integrated circuit dice is coupled to an interposer, and wherein the integrated circuit module further comprises a second plurality of conductive elements disposed on a top surface of each of the second plurality of integrated circuit dice.

2. The stacked package, as set forth in claim 1, wherein the interposer comprises:
a first solder mask layer;
one or more conductive trace layers disposed on the first solder mask layer;
a polyimade layer disposed on the one or more conductive trace layers; and
a second solder mask layer disposed on the polyimade layer.

3. The stacked package, as set forth in claim 1, wherein at least one of the first plurality of integrated circuit dice comprises a memory die.

4. The stacked package, as set forth in claim 1, wherein the at least one of the first plurality of integrated circuit dice comprises a processor die.

5. The stacked package, as set forth in claim 1, wherein the carrier comprises a copper carrier.

6. The stacked package, as set forth in claim 1, wherein each of the first plurality of conductive elements comprise solder balls.

7. The stacked package, as set forth in claim 1, wherein at least one of the second plurality of integrated circuit dice comprises a memory die.

8. The stacked package, as set forth in claim 1, wherein the at least one of the second plurality of integrated circuit dice comprises a processor die.

9. The stacked package, as set forth in claim 1, wherein each of the second plurality of conductive elements comprise solder balls.

10. The stacked package, as set forth in claim 1, wherein the integrated circuit module comprises a plurality of bond wires electrically coupled between pads on the top surface of each of the second plurality of integrated circuit dice and one or more conductive traces of the interposer.

11. The stacked package, as set forth in claim 1, wherein the interposer comprises a plurality of vias formed therethrough, wherein each of the plurality of vias is filled with a conductive material and wherein each of the plurality of vias is aligned with one of the first plurality of conductive elements.

12. A stacked package comprising:
a multi-chip package comprising a first plurality of integrated circuit dice, wherein a bottom surface of each of the first plurality of integrated circuit dice is coupled to a carrier, and wherein the multi-chip package further comprises a first plurality of conductive elements disposed on a top surface of each of the first plurality of integrated circuit dice;

an integrated circuit module comprising a second plurality of integrated circuit dice, wherein a bottom surface of each of the second plurality of integrated circuit dice is coupled to an interposer, and wherein the integrated circuit module further comprises a second plurality of conductive elements disposed on a top surface of each of the second plurality of integrated circuit dice; and a system board electrically coupled to the second plurality of conductive elements, wherein each of the first plurality of integrated circuit dice is electrically coupled to each of the second plurality of integrated circuit dice and electrically coupled to the system board.

13. The stacked package, as set forth in claim 12, wherein each of the second plurality of integrated circuit dice is electrically coupled to the system board.

14. The stacked package, as set forth in claim 12, wherein each of the first plurality of conductive elements and each of the second plurality of conductive elements comprises a solder ball.

15. The stacked package, as set forth in claim 12, wherein the integrated circuit module comprises a plurality of bond wires electrically coupled between pads on the top surface of each of the second plurality of integrated circuit dice and one or more conductive traces of the interposer.

16. The stacked package, as set forth in claim 12, wherein the interposer comprises a plurality of vias formed therethrough, wherein each of the plurality of vias is filled with a conductive material and wherein each of the plurality of vias is aligned with one of the first plurality of conductive elements.

* * * * *

UNITED STATES PATENT AND TRADEMARK OFFICE
CERTIFICATE OF CORRECTION

| | | |
|---|---|---|
| PATENT NO. | : 8,212,348 B2 | Page 1 of 1 |
| APPLICATION NO. | : 12/839834 | |
| DATED | : July 3, 2012 | |
| INVENTOR(S) | : Todd O. Bolken et al. | |

It is certified that error appears in the above-identified patent and that said Letters Patent is hereby corrected as shown below:

In column 8, line 28, in Claim 2, delete "a polyimade" and insert -- a polyimide --, therefor.

In column 8, line 30, in Claim 2, delete "polyimade" and insert -- polyimide --, therefor.

Signed and Sealed this
Twenty-eighth Day of August, 2012

David J. Kappos
*Director of the United States Patent and Trademark Office*